(12) United States Patent
Agan

(10) Patent No.: US 6,181,167 B1
(45) Date of Patent: Jan. 30, 2001

(54) FULL DUPLEX CMOS COMMUNICATION

(75) Inventor: Tom A. Agan, Maple Grove, MN (US)

(73) Assignee: Honeywell Inc., Morristown, NJ (US)

( * ) Notice: Under 35 U.S.C. 154(b), the term of this patent shall be extended for 0 days.

(21) Appl. No.: 09/216,285

(22) Filed: Dec. 18, 1998

(51) Int. Cl.[7] .............................................. H03K 19/0175

(52) U.S. Cl. ............................................ 326/86; 326/83

(58) Field of Search .................. 326/86, 82, 83, 326/30

(56) References Cited

U.S. PATENT DOCUMENTS

| 4,859,877 | * | 8/1989 | Cooperman et al. | 307/443 |
| 5,801,549 | * | 9/1998 | Cao et al. | 326/86 |

* cited by examiner

Primary Examiner—Michael Tokar
Assistant Examiner—Anh Tran
(74) Attorney, Agent, or Firm—Kris T. Fredrick

(57) ABSTRACT

Full duplex CMOS communication is accomplished over a single electrical interconnect by transmitting a signal in one direction using standard voltages indicative of CMOS logic levels, and by measuring the current needed to maintain these voltages to determine the signal transmitted in the opposite direction.

13 Claims, 2 Drawing Sheets

FULL DUPLEX CMOS COMMUNICATION

BACKGROUND OF THE INVENTION

1. Field of the Invention

The present invention relates to a device for the simultaneous transmission of two data signals over the same line in opposite directions.

2. Description of the Prior Art

The most common method of allowing two electronic modules to communicate with each other via simultaneous bi-directional (full duplex) data flow is by connecting them together with two electrical lines, one for data transmission in each direction. In an effort to reduce the number of electrical lines connecting electronic devices, and consequently the number of pins or terminals on an electronic device devoted to this communication, technology has been developed to allow for the transmission of two data sequences in opposite directions over the same communication line.

Two ways of doing this are frequency multiplexing, and time multiplexing. Frequency multiplexing is not at all useful when dealing with standard logic levels within a circuit, and time multiplexing is inherently slow, due to the fact that you can only send one signal in one direction at a time.

To overcome these problems, technology has been developed to allow two electrical circuits to communicate with each other over a single electrical interconnect in both directions at the same time. Past technology for doing this has been slow in terms of switching rate, required considerable power consumption, and/or required impedance matching with the transmission line, all of which are not desirable.

It is an object of the present invention to provide a means for simultaneous full duplex communication over a single electrical interconnect at standard CMOS logic levels and thresholds.

It is also an object of the present invention to provide this communication without making speed power ratio sacrifices, or requiring a matched line impedance.

BRIEF SUMMARY OF THE INVENTION

The present invention solves these and other needs by providing a CMOS circuit which will allow two electronic modules to communicate individual data in each direction simultaneously over a single line without compromising the speed power ratio. This is accomplished by providing two transceivers on opposite ends of an electrical interconnect. The first transceiver consists of a voltage driver with a resistive load between the voltage driver's output and the input/output terminal of the first transceiver. Across this resistive load is placed a current sensing circuit. This current sensor acts as the receiver portion of the first transceiver. The second transceiver consists of a voltage receiver with its input connected to the input/output terminal of the second transceiver. Also connected to this input/output terminal of the second transceiver are the send logic high and send logic low circuit blocks which function as the transmitter portion of the second transceiver by allowing current to flow when they are on.

DETAILED DESCRIPTION OF THE INVENTION

Figure 1:
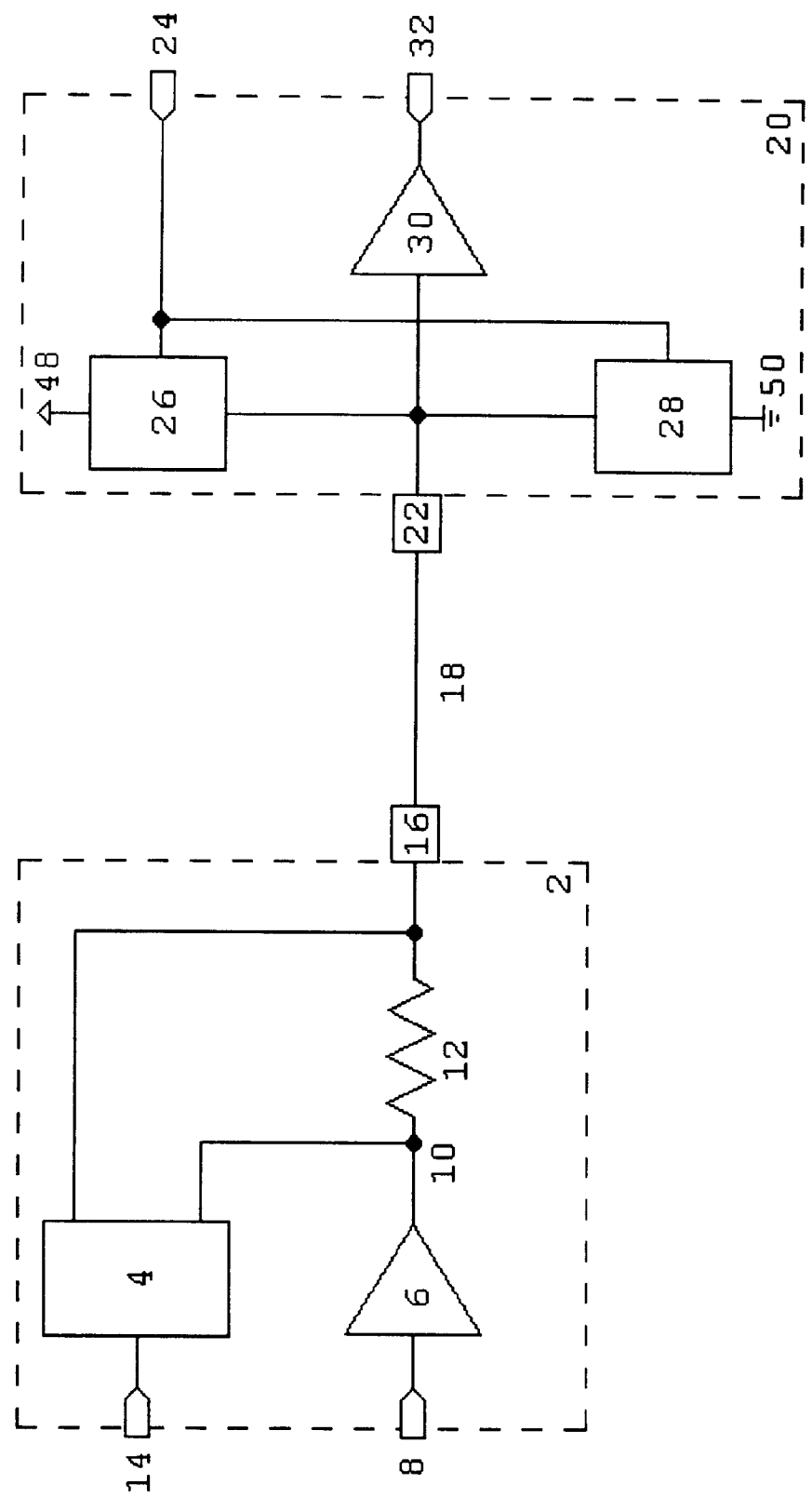
FIG. 1 is a conceptual diagram of the full duplex CMOS communication circuit.

FIG. 1 shows the conceptual diagram of the present invention. A first transceiver 2 and a second transceiver 20 are shown connected by an electrical interconnect 18 between a first input/output terminal 16 of the first transceiver 2 and a second input/output terminal 22 of the second transceiver 20.

The first transceiver 2 consists of a voltage driver 6 having an input and an output. The input of the voltage driver 6 is connected to a first transmission signal 8 which is desired to be transmitted by the first transceiver 2. The output of the voltage driver 6 is connected to a first end of a resistive load 12, and the node there between designated as 10. A second end of the resistive load 12 is connected to the first input/output terminal 16.

The first transceiver further consists of a current sensing circuit 4 which has a first input connected to the node 10, and a second input connected to the first input/output terminal 16. The output of the current sensing circuit provides the first received signal 14.

The second transceiver 20 consists of a voltage receiver 30 having an input and an output. The input of the voltage receiver 30 is connected to the second input/output terminal 22. The output of the voltage receiver 30 provides the second received signal 32.

The second transceiver 20 further consists of a send logic high circuit 26 and a send logic low circuit 28. These two circuits have as their inputs, a second transmission signal 24 which is desired to be transmitted by the second transceiver 20. The send logic high circuit 26 is connected between the positive supply voltage 48 and the second input/output terminal 22. The send logic low circuit 28 is connected between the circuit ground 50 and the second input/output terminal 22.

The voltage driver 6 serves to control the voltage level on the electrical interconnect 18. This voltage level is indicative of the first transmission signal 8, and can be measured by the voltage receiver 30, completing the signal transmission in a first direction. The send logic high circuit 26 and send logic low circuit 28 serve to control the current flowing through the electrical interconnect 18. This current is indicative of the second transmission signal 24, and can be measured by the current sensing circuit 4 placed across the resistive load 12, completing the signal transmission in a second direction.

Figure 2:
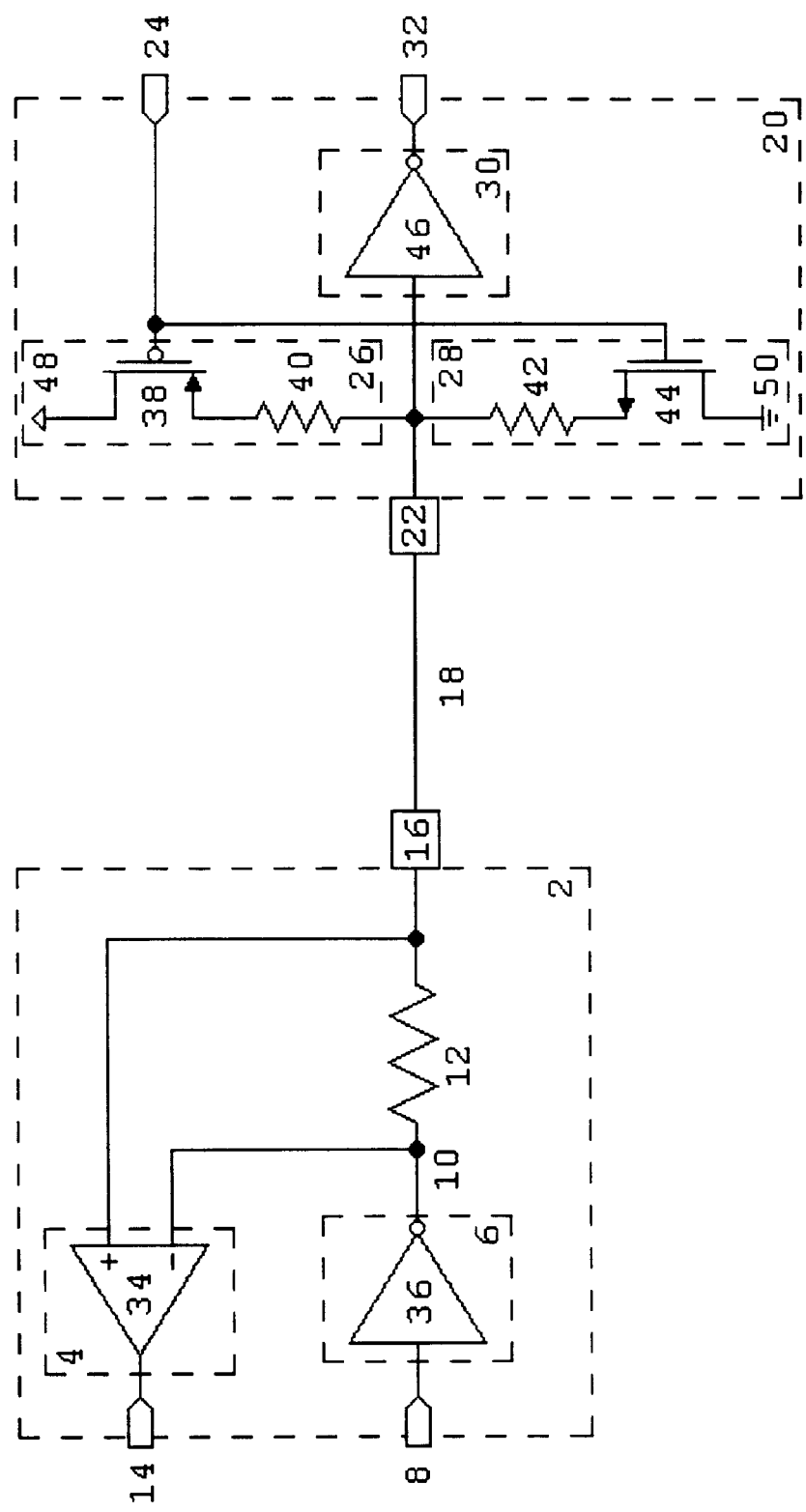
FIG. 2 is a more detailed schematic of the preferred embodiment.

FIG. 2 shows a more detailed preferred embodiment of the present invention. The current sensing circuit 4 consists of a differential amplifier 34 with its inverting input connected to the node 10, and its non-inverting input connected to the first input/output terminal 16 of the first transceiver 2. The output of the differential amplifier 34 provides the first received signal 14.

The voltage driver 6 consists of a first inverter 36 with the first transmission signal 8 applied to the input of the first inverter 6, and the output of the first inverter 6 applied to the node 10.

The voltage receiver 30 consists of a second inverter 46 with its input being connected to the second input/output terminal 22 of the second transceiver 20, and its output providing the second received signal 32.

The send logic high circuit 26 consists of a PMOS transistor 38 with its drain connected to the positive supply voltage 48, its source connected to a send logic high resistor 40, and its gate connected to the second transmission signal 24. The other end of the send logic high resistor 40 is connected to the second input/output terminal 22.

The send logic low circuit 28 consists of an NMOS transistor 44 with its drain connected to the circuit ground 50, its source connected to a send logic low resistor 42, and its gate connected to the second transmission signal 24. The other end of the send logic low resistor 42 is connected to the second input/output terminal 22.

The circuit of FIG. 2 operates in the following manner, with four different cases described, one for each combination of a desired first transmission signal 8 and a desired second transmission signal 24.

Case 1: for the case in which the first transmission signal 8 is high, representing a logical 1, and the second transmission signal 24 is low, representing a logical 0, the circuit operates as follows. The high signal at 8 is inverted by the first inverter 36, supplying a low voltage on the node 10. The application of the second transmission signal 24, being low in this case, to the gates of the CMOS transistors 38, 44 will cause the PMOS transistor 38 to be turned on, and the NMOS transistor 44 to be turned off. With the PMOS transistor 38 conducting, the voltage on the electrical interconnect 18 will be determined by the resistive load 12 and the send logic high resistor 40 acting as a voltage divider between the positive supply voltage 48 and the low voltage on the node 10. With the values of the resistive load 12 and the send logic high resistor 40 chosen appropriately, the voltage on the electrical interconnect 18 will be slightly positive with respect to the low voltage on the node 10. This positive voltage will be received by the differential amplifier 34, resulting in the first received signal 14. The combination of the first received signal 14 and the first transmission signal 8 uniquely identifies the second transmission signal 24, allowing it to be reconstructed.

Case 2: for the case in which both the first transmission signal 8 and the second transmission signal 24 are high, representing logic 1's, the circuit operates as follows. As in Case 1, the high signal at 8 is inverted by the first inverter 36, supplying a low voltage to the node 10. The application of the second transmission signal 24, being high in this case, to the gates of the CMOS transistors 38, 44, will cause the PMOS transistor 38 to be turned off, and the NMOS transistor 44 to be turned on. With the NMOS transistor conducting, the voltage in the electrical interconnect 18 will be low, and no voltage drop will be detected across load resistance 12 by the differential amplifier 34. This results in a first received signal 14 being a zero voltage, indicating that the second transmission signal 24 and the first transmission signal 8 are of the same level. Knowing the first transmission signal 8 allows the second transmission signal 24 to be found within the first transceiver 2.

Case 3: For the case in which both the first transmission signal 8 and the second transmission signal 24 are low, representing logic 0's, the circuit operates in a manner analogous to Case 2. The voltage on the node 10 will be high, and with the PMOS transistor 38 conducting, the voltage on the electrical interconnect will be high as well. As in Case 2, there will be no voltage drop across the load resistance 12, and consequently the first received signal 14 will be low. This again implies that the first transmission signal 8 and the second transmission signal 24 are of the same level, so the second transmission signal 24 can be found within the first transceiver 2.

Case 4: For the case in which the first transmission signal 8 is low, representing a logical 0, and the second transmission signal 24 is high, representing a logical 1, the circuit operates as follows. The low signal at 8 is inverted by the first inverter 36, supplying a high voltage on the node 10. The application of the second transmission signal 24, being high in this case, to the gates of the CMOS transistors 38, 44, will cause the PMOS transistor 38 to be turned off, and the NMOS transistor 44 to be turned on. With the NMOS transistor 44 conducting, the voltage on the electrical interconnect 18 will be determined by the resistive load 12 and the send logic low resistor 42 acting as a voltage divider between the circuit ground 50 and the high voltage on the node 10. With the values of the resistive load 12 and the send logic low resistor 42 chosen appropriately, the voltage on the electrical interconnect 18 will be slightly negative with respect to the high voltage on the node 10. This negative voltage will be received by the differential amplifier 34, resulting in the first received signal 14. The combination of the first received signal 14 and the first transmission signal 8 uniquely identify the second transmission signal 24, allowing it to be reconstructed.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A device for the simultaneous transmission of a first data signal and a second data signal over a single communication line in opposite directions, wherein the data signals are represented by a voltage and a current, respectively, present on said line, said device having a positive supply voltage and a circuit ground, said device comprising:

a first transceiver comprising:
a first input/output terminal;
a resistive load having first and second ends, said second end of said resistive load connected to said first input/output terminal;
a voltage driver having an input connected to a first transmission signal, and having an output connected to said first end of said resistive load;
a current sensing circuit having a first input, a second input and an output, said first input connected to said first input/output terminal, said second input connected to said first end of the resistive load, said output providing a first received signal;

a second transceiver comprising:
a second input/output terminal;
a voltage receiver having a single input connected to said second input/output terminal, and having an output providing a second received signal;
a send logic high circuit connected between said positive supply voltage and said second input/output terminal, and having an input connected to a second transmission signal;
a send logic low circuit connected between said circuit ground and said second input/output terminal, and having an input connected to said second transmission signal; and said communication line connecting said first input/output terminal of said first transceiver to said second input/output terminal of said second transceiver.

2. The device of claim 1, wherein said voltage driver comprises an inverter.

3. The device of claim 1, wherein said current sensing circuit comprises a differential amplifier.

4. The device of claim 1, wherein said voltage receiver comprises an inverter.

5. The device of claim 1, wherein said send logic high circuit comprises:
   a send logic high resistor having first and second ends; and
   a PMOS transistor having a drain connected to said positive supply voltage, a gate connected to said second transmission signal, and a source connected to said first end of said send logic high resistor; and
   wherein said second end of said send logic high resistor is connected to said second input/output terminal.

6. The device of claim 1, wherein said send logic low circuit comprises:
   a send logic low resistor having first and second ends; and
   a NMOS transistor having a drain connected to said circuit ground, a gate connected to said second transmission signal, and a source connected to said first end of said send logic low resistor; and
   wherein said second end of said send logic low resistor is connected to said second input/output terminal.

7. A device for the simultaneous transmission of a first data signal and a second data signal over a single communication line in opposite directions, wherein the data signals are represented by a voltage and a current, respectively, present on said line, said device having a positive supply voltage and a circuit ground, said device comprising:
   a first transceiver, wherein said first transceiver comprises:
      a first input/output terminal;
      a resistive load, wherein said first input/output terminal is connected to a first end of said resistive load;
      a voltage driver, said voltage driver comprising an inverter having a driver input operative to receive a first transmission signal and having a driver output connected to a second end of said resistive load;
      a current sensing circuit, said current sensing circuit comprising a differential amplifier having a first amplifier input, a second amplifier input, and an amplifier output, wherein said first amplifier input is connected to said first input/output terminal, wherein said second input is connected to said second end of said restrictive load, said output providing a first received signal; and
   a second transceiver comprising:
      a second input/output terminal;
      a voltage receiver, said voltage receiver comprising an inverter having a single receiver input connected to said second input/output terminal, and having a receiver output providing a second received signal;
      a send logic high circuit connected between said positive supply voltage and said second input/output terminal, wherein said send logic high circuit is operative to receive a second transmission signal;
      a send logic low circuit connected between said circuit ground and said second input/output terminal, wherein said send logic low circuit is operative to receive said second transmission signal, and wherein said communication line connects said first input/output terminal to said second input/output terminal.

8. The device of claim 7, wherein said send logic high circuit comprises:
   a send logic high resistor; and
   a PMOS transistor having a PMOS drain, a PMOS gate, and a PMOS source, wherein said PMOS drain is connected to said positive supply voltage, wherein said PMOS gate is connected to said second data signal, and wherein said send logic high resistor is connected between said PMOS source and said second input/output terminal.

9. The device of claim 7, wherein said send logic low circuit comprises:
   a send logic low resistor; and
   an NMOS transistor having an NMOS drain, an NMOS gate, and an NMOS source, wherein said NMOS drain is connected to said circuit ground, wherein said NMOS gate is connected to said second data signal, and wherein said send logic low resistor is connected between said NMOS source and said second input/output terminal.

10. The device of claim 7, wherein said send logic high circuit comprises:
    a send logic high resistor; and
    a PMOS transistor having a PMOS drain, a PMOS gate, and a PMOS source, wherein said PMOS drain is connected to said positive supply voltage, wherein said PMOS gate is connected to said second data signal, and wherein said send logic high resistor is connected between said PMOS source and said second input/output terminal, and wherein said send logic low circuit comprises:
    a send logic low resistor; and
    an NMOS transistor having an NMOS drain, an NMOS gate, and an NMOS source, wherein said NMOS drain is connected to said circuit ground, wherein said NMOS gate is connected to said second data signal, and wherein said send logic low resistor is connected between said NMOS source and said second input/output terminal.

11. A method for the simultaneous transmission of data signals over a single communication line in opposite directions, said method comprising the steps of:
    accepting a first data signal at a first transceiver, wherein said first data signal is characterized by a signal voltage;
    accepting a second data signal at a second transceiver, wherein said second data signal is characterized by a signal current;
    applying said signal current to said communication line at the second transceiver to communicate said second data signal to said first transceiver, wherein said signal current is provided by logic circuitry;
    applying said signal voltage to said communication line at the first transceiver to communicate said first data signal to said second transceiver, wherein said signal voltage is provided by a voltage driver at said first transceiver;
    obtaining said signal voltage at said second transceiver to receive said first data signal; and
    measuring said signal current at said first transceiver to receive said second data signal.

12. The method of claim 11, wherein said logic circuitry includes a send logic high circuit and a send logic low circuit.

13. The method of claim 12, wherein said send logic high circuit comprises:

a send logic high resistor; and a PMOS transistor having a PMOS drain, a PMOS gate, and a PMOS source, wherein said PMOS drain is connected to said positive supply voltage, wherein said PMOS gate is connected to said second data signal, and wherein said send logic high resistor is connected between said PMOS source and said second input/output terminal, and wherein said send logic low circuit comprises:

a send logic low resistor; and an NMOS transistor having an NMOS drain, an NMOS gate, and an NMOS source, wherein said NMOS drain is connected to said circuit ground, wherein said NMOS gate is connected to said second data signal, and wherein said send logic low resistor is connected between said NMOS source and said second input/output terminal.

* * * * *